United States Patent
Ware et al.

(10) Patent No.: US 10,198,314 B2
(45) Date of Patent: Feb. 5, 2019

(54) MEMORY DEVICE WITH IN-SYSTEM REPAIR CAPABILITY

(71) Applicant: Rambus Inc., Sunnyvale, CA (US)

(72) Inventors: Frederick A. Ware, Los Altos Hills, CA (US); Suresh Rajan, Fremont, CA (US); Brent Haukness, Monte Sereno, CA (US); Scott C. Best, Palo Alto, CA (US); Wayne F. Ellis, Campbell, CA (US)

(73) Assignee: Rambus Inc., Sunnyvale, CA (US)

( * ) Notice: Subject to any disclaimer, the term of this patent is extended or adjusted under 35 U.S.C. 154(b) by 321 days.

(21) Appl. No.: 14/285,467

(22) Filed: May 22, 2014

(65) Prior Publication Data

US 2014/0351673 A1 Nov. 27, 2014

Related U.S. Application Data

(60) Provisional application No. 61/826,956, filed on May 23, 2013, provisional application No. 61/910,820, filed on Dec. 2, 2013.

(51) Int. Cl.
*G06F 11/10* (2006.01)
*G11C 29/42* (2006.01)
(Continued)

(52) U.S. Cl.
CPC .......... *G06F 11/1048* (2013.01); *G11C 29/42* (2013.01); *G11C 29/44* (2013.01); *G11C 29/4401* (2013.01); *G11C 29/785* (2013.01); *G11C 29/808* (2013.01); *G06F 11/1092* (2013.01); *G06F 2211/1092* (2013.01);
(Continued)

(58) Field of Classification Search
CPC .. G06F 11/10; G06F 11/1004; G06F 11/1008; G06F 11/1012; G06F 11/1024; G06F 11/1044; G06F 11/1048; G06F 11/1064; G06F 11/1068; G06F 11/1076; G11C 29/04; G11C 29/0401; G11C 29/70;
(Continued)

(56) References Cited

U.S. PATENT DOCUMENTS

| | | | |
|---|---|---|---|
| 6,408,401 B1 | 6/2002 | Bhavsar et al. | |
| 6,542,420 B2 | 4/2003 | Takase | |

(Continued)

OTHER PUBLICATIONS

Nicolaidis et al., "A Diversified Memory Built-In Self-Repair Approach for Nanotechnologies," Proceedings of the 22nd IEEE VLSI Test Symposium, 2004. 6 pages.
(Continued)

*Primary Examiner* — Christian M Dorman
(74) *Attorney, Agent, or Firm* — Lance Kreisman; Peninsula Patent Group

(57) ABSTRACT

A memory device is disclosed that includes a row of storage locations to store a data word, and a spare row element. The data word is encoded via an error code for generating error information for correcting X bit errors or detecting Y bit errors, where Y is greater than X. The spare row element has substitute storage locations. The logic is responsive to detected errors to (1) enable correction of a data word based on the error information where there are no more than X bit errors, and (2) substitute the spare row element for a portion of the row where there are at least Y bit errors in the data word.

17 Claims, 11 Drawing Sheets

(51) Int. Cl.
*G11C 29/44* (2006.01)
*G11C 29/00* (2006.01)
*G11C 11/40* (2006.01)
*G11C 29/04* (2006.01)

(52) U.S. Cl.
CPC ...... *G11C 11/40* (2013.01); *G11C 2029/0409* (2013.01); *G11C 2029/0411* (2013.01)

(58) Field of Classification Search
CPC ....... G11C 29/74; G11C 29/76; G11C 29/765; G11C 29/78; G11C 29/783
See application file for complete search history.

(56) References Cited

U.S. PATENT DOCUMENTS

| | | | |
|---|---|---|---|
| 6,785,837 B1 | 8/2004 | Kilmer et al. | |
| 7,562,285 B2 | 7/2009 | Wang et al. | |
| 7,627,792 B2 | 12/2009 | Di Ronza et al. | |
| 7,734,985 B2 | 6/2010 | Bains | |
| 7,783,957 B2 | 8/2010 | Carnevale et al. | |
| 7,831,882 B2 | 11/2010 | Tsern et al. | |
| 7,831,888 B2 | 11/2010 | Wang et al. | |
| 7,836,378 B2 | 11/2010 | Shaeffer et al. | |
| 7,882,423 B2 | 2/2011 | Wang et al. | |
| 8,132,077 B2 | 3/2012 | Wang et al. | |
| 2003/0179616 A1* | 9/2003 | Wohlfahrt | G06F 11/1008 365/200 |
| 2003/0204798 A1* | 10/2003 | Adams | G06F 11/1008 714/723 |
| 2007/0220396 A1* | 9/2007 | Jackson | G06F 11/1008 714/758 |
| 2009/0235113 A1 | 9/2009 | Shaeffer et al. | |
| 2010/0017650 A1 | 1/2010 | Chin et al. | |
| 2010/0269021 A1* | 10/2010 | Gower | G06F 11/10 714/764 |
| 2010/0332895 A1* | 12/2010 | Billing | G06F 11/1008 714/6.13 |
| 2011/0119551 A1 | 5/2011 | Tsern et al. | |
| 2012/0204079 A1 | 8/2012 | Takefman et al. | |
| 2012/0284586 A1* | 11/2012 | Wang | G11C 7/1006 714/763 |
| 2013/0058145 A1* | 3/2013 | Yu | G11C 29/50 365/49.17 |
| 2013/0182489 A1* | 7/2013 | Wang | G11C 11/40 365/149 |
| 2014/0036569 A1* | 2/2014 | Yoon | G06F 11/1048 365/148 |

OTHER PUBLICATIONS

Wu et al., "A Memory Yield Improvement Scheme Combining Built-In Self-Repair and Error Correction Codes," IEEE International Test Conference, Paper 14.1, 2012, pp. 1-9. 9 pages.

* cited by examiner

MEMORY DEVICE WITH IN-SYSTEM REPAIR CAPABILITY

CROSS-REFERENCE TO RELATED APPLICATIONS

This application is a Non-Provisional of and claims priority to U.S. Patent Application Ser. No. 61/826,956, filed May 23, 2013, entitled DRAM METHOD, COMPONENTS, AND SYSTEM CONFIGURATIONS FOR ERROR MANAGEMENT, and incorporated by reference in its entirety herein. This application also claims priority to U.S. Patent Application Ser. No. 61/910,820, filed Dec. 2, 2013, entitled DRAM METHOD, COMPONENTS, AND SYSTEM CONFIGURATIONS FOR ERROR MANAGEMENT, and incorporated by reference in its entirety herein.

TECHNICAL FIELD

The disclosure herein relates to memory systems, and more specifically to in-system memory repair apparatus and methods.

BACKGROUND

Error codes are used in a variety of signaling systems to detect and, in some cases, correct errors relating to data transmission and storage. The codes generally provide redundancy to the original data so that, when the data is encoded via a particular error code algorithm, a limited number of data errors may be identified and possibly corrected upon decoding. The redundant portions of the encoded data may take the form of checksums, parity bits, or the like, depending on the type of error code employed.

For memory systems that employ error codes, the overhead often employed with the encoding may limit the effectiveness of the code to a single-bit error in a given word. As a result, only a certain number of hard errors, such as those caused by storage cell failures, may be acceptable for a given memory component before the component fails as a reliable device. The failures become even more costly when memory devices are assembled onto memory modules, and the modules discarded for failing to pass final testing.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of memory systems, devices and methods are disclosed herein. One embodiment of a memory device is disclosed that includes a row of storage locations to store a data word, and a spare row element. The data word is encoded via an error code for generating error information for correcting X bit errors or detecting Y bit errors, where Y is greater than X. The spare row element has substitute storage locations. The logic is responsive to detected errors to (1) enable correction of a data word based on the error information where there are no more than X bit errors, and (2) substitute the spare row element for a portion of the row where there are at least Y bit errors in the data word.

In a further embodiment, a memory device is disclosed that includes an array of memory units that form plural rows of storage locations. The storage locations store data words encoded via an error code. Each memory unit includes plural normal sub-rows of normal storage locations and a spare sub-row. Each row includes an aggregate number of sub-rows that correspond to a given sub-row location across all of the memory units. Repair logic detects at least one error in a row based on the error code, and selectively substitutes a sub-row including the detected error with the spare sub-row.

In yet another embodiment, a method of operation in a memory device is disclosed. The method includes activating a row of storage cells. The row of storage cells includes a data word encoded via an error code for generating error information used for correcting up to X bit errors or detecting up to Y bit errors, where Y is greater than X. A determination is made as to whether any bit errors exist in the row. The detected bit error(s) are corrected (1) enabling correction of a data word having no more than X bit errors, and (2) substituting a spare row element for a portion of the row in response to detecting at least Y bit errors in the data word.

Figure 1:
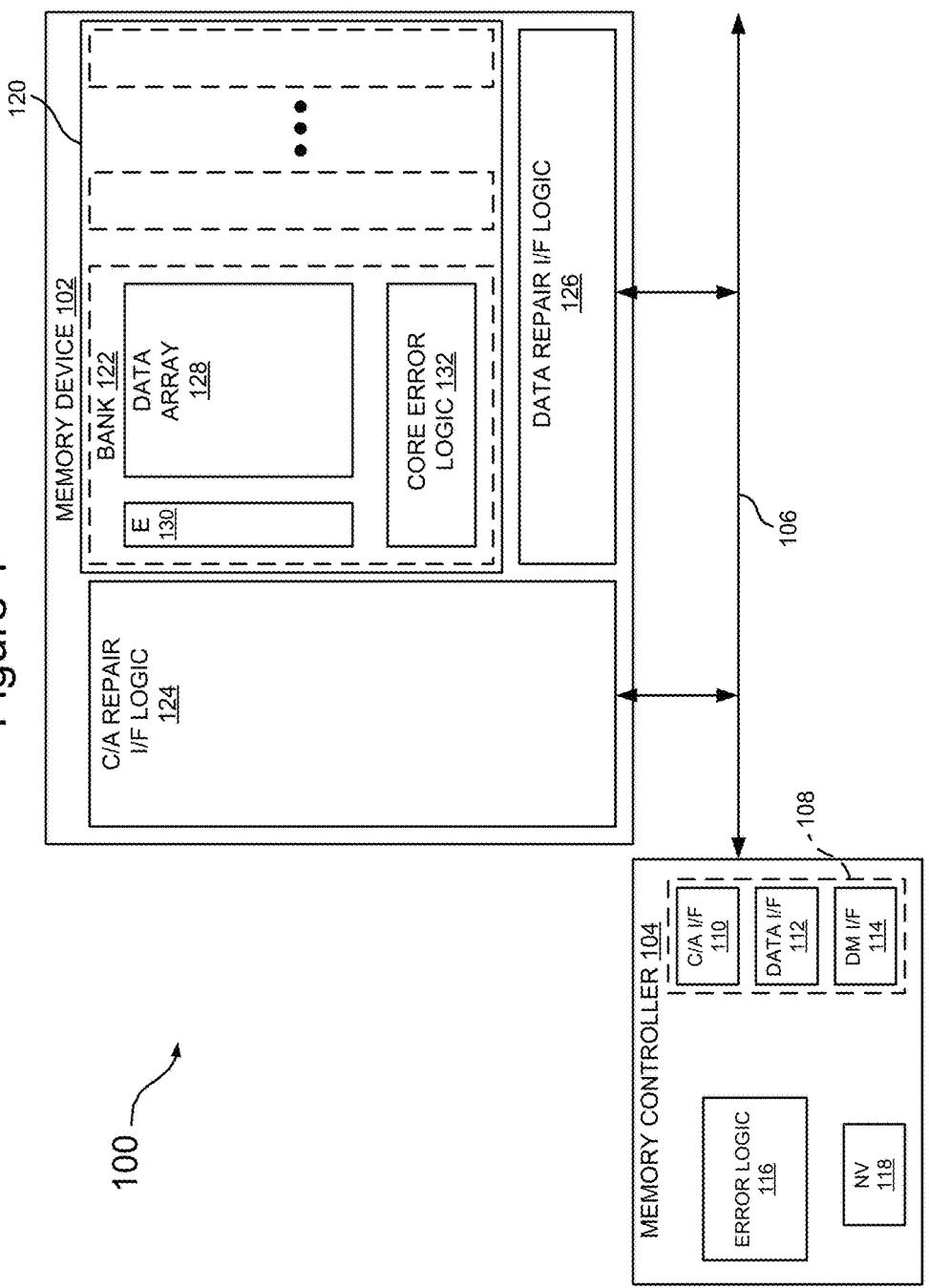
FIG. 1 illustrates one embodiment of a memory system that employs a memory controller and a memory device.

Referring to FIG. 1, one embodiment of a memory system architecture, generally designated 100, employs a memory device 102 coupled to a memory controller 104 via a signaling bus 106. The memory device may be one of a group of devices mounted on, for example, a memory module (not shown). While the following embodiments emphasize dynamic random access memory (DRAM) applications, the system described herein may be employed in any memory environment where relatively high-speed storage and retrieval of information is desired.

Further referring to FIG. 1, the memory controller 104 may take the form of a dynamic random access memory (DRAM) controller that directs the transfer of data, command and address signals within the memory system 100.

The memory controller 104 includes an interface 108 that may include a control-address (C/A) interface circuit 110 and a data interface circuit 112. For some embodiments, the controller 104 further includes a data mask interface 114 for write masking operations, and, in some embodiments, to indicate the presence of read data errors, as more fully described below. In some optional embodiments, the memory controller 104 may include error logic 116 to monitor error repair remappings that take place in the memory device 102, and/or include optional non-volatile storage 118 to store the memory remappings. The memory controller 104 may be realized by, e.g., a discrete memory controller separate from a requestor integrated circuit (IC), or any IC that controls a DRAM, including any type of system-on-chip (SoC).

With continued reference to FIG. 1, for one embodiment, the memory device 102 takes the form of a DRAM that includes a memory core 120 with multiple banks 122. For one specific embodiment, the memory device may hold approximately 8 Gb of storage cells, and may be organized into eight independent banks. The memory device also includes interface circuitry for communicating with the memory controller 104 in the form of control-address (C/A) repair interface logic 124 and data repair interface logic 126. The C/A repair interface logic 124 and the data repair interface logic 126 may be shared globally with all of the memory device banks 122 in transferring C/A and data signals between the memory device 102 and the memory controller 104.

Further referring to FIG. 1, each memory device bank 122 generally includes plural storage cells logically organized into a data array 128 to store data, and an error array 130 having storage cells for storing error correction code (ECC) information on a per-column basis. As explained in further detail below, the error array 130 is merely a logical representation of additional storage cells that complement and form an extended portion of each column of the data array 128. Core error logic 132 manages the use of the error array information for repair operations.

Figure 2:
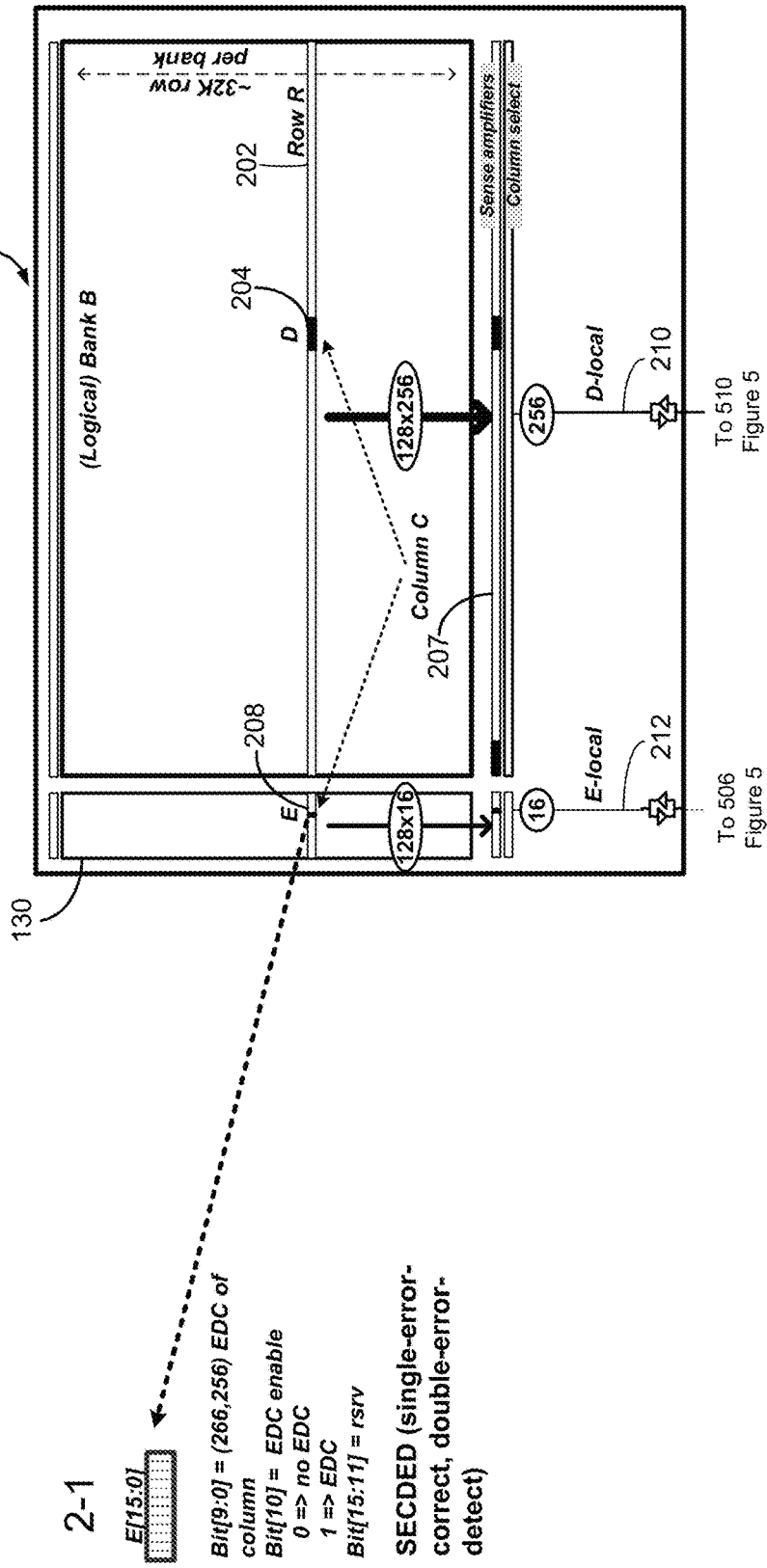
FIG. 2 illustrates an embodiment of a logical arrangement of a bank within a memory core of the memory device of FIG. 1.

FIG. 2 illustrates one specific embodiment of a logical bank arrangement corresponding to one of the banks 122 of FIG. 1. The bank, organized logically and generally designated 200, includes plural rows 202 or pages of storage cells that may be accessed via a row address. Each row is organized into plural data columns 204, each of which may be specified by a column address. For some embodiments, a given bank may have on the order of 32K rows, with each row having on the order of 128 addressable data columns.

Further referring to FIG. 2, each data column 204 is associated with extra storage cells or bits beyond, at least for this example, a typical 256-bit column. These per-column bits are shown in FIG. 2 as a logically separate portion of the memory core, at 208, and may be referred to herein in aggregate as an "error array." For one embodiment, each data column 204 has an additional 16-bit resource in the error array 130 to store parity information generated by an error detection and correction code (EDC) corresponding to the data column.

With continued reference to FIG. 2, a representative data structure corresponding to the extra bits associated with each data column is shown in detailed portion labeled 2-1 in FIG. 2. For one specific embodiment, the EDC code corresponds to a single-error correct, double-error detect (SECDED) code having a (266, 256) format capable of correcting a single error or detecting a double error in a 256-bit column of data. The result of the coding includes the original 256 data bits, stored in the data array, and 10 parity bits that are stored in the error array portion of the corresponding data column.

Further referring to FIG. 2, one embodiment for the core error logic 132 (FIG. 1) for the bank 200 includes sense amplifier circuitry 207 to sense an addressed row 204 of storage cells in an accessed row R. A local data bus 210 couples to the sense amplifiers that sense the storage cells of the accessed column C of the data array 126. A similar error information bus 212 directs data between the sense amplifiers that sense the error array 130 and the data/repair interface logic 126.

Figure 3A:
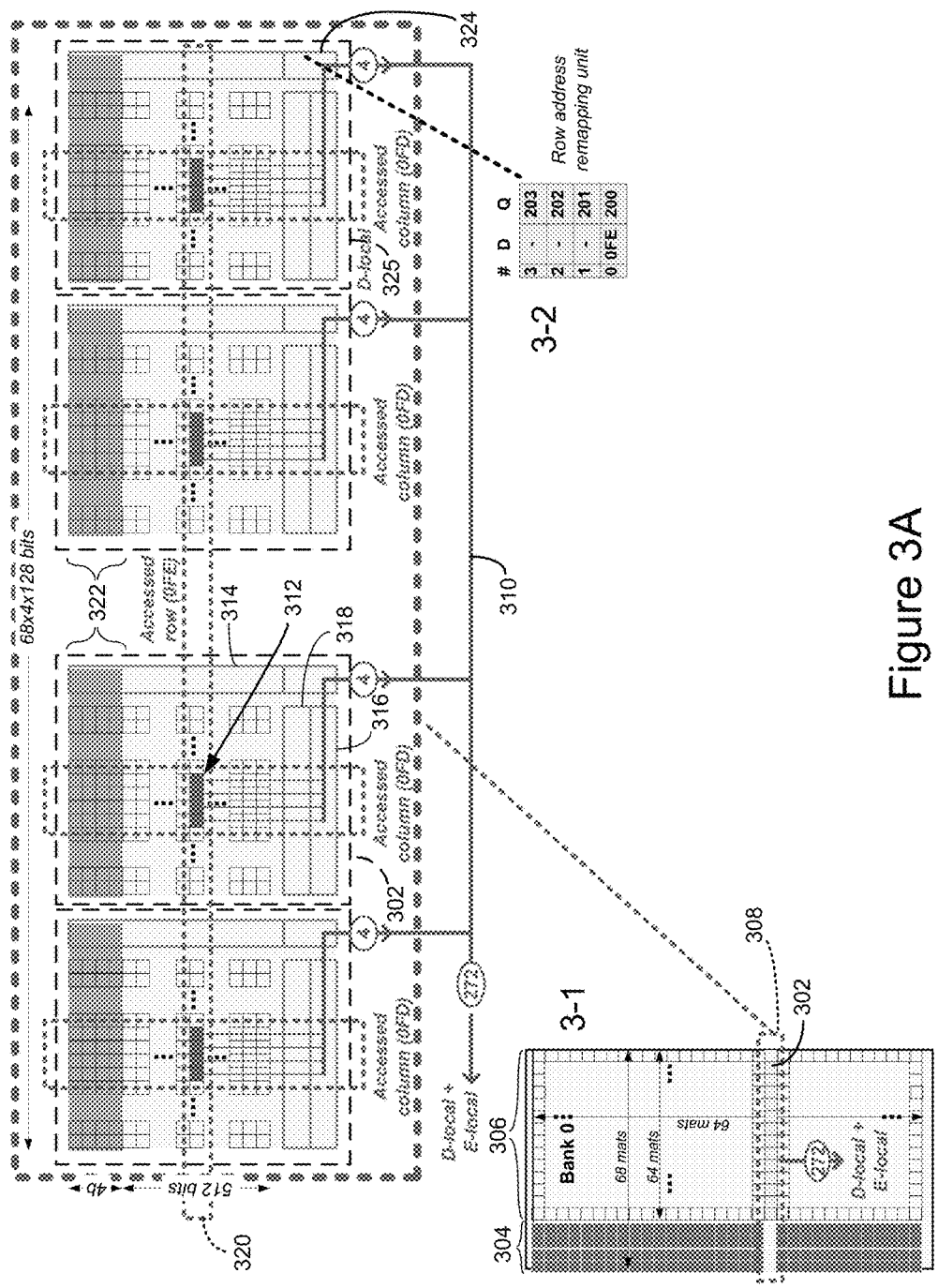
FIG. 3A illustrates one embodiment of a configuration of rows and mats for use in the bank of FIG. 3.

FIG. 3A illustrates further detail of one embodiment of a bank Bank0, such as that described above and shown in FIG. 2. In a detailed view labeled 3-1, it can be seen that the bank includes a 68×64 array of memory units that may be referred to as "mat" blocks 302. The four vertical stripes of memory units, or mats on the left side of detailed view 3-1, at 304, contain the EDC code or error information, and form a portion of the logical "error array" 130 of FIG. 1. The 64 vertical stripes of mats on the right, at 306, contain the data information, and form a portion of the data array 128. A horizontal group of mats (shown across the middle of the bank), at 308, may operate together to perform row activate and column read/write operations described more fully below. These 68 activated mats drive and receive the column data and EDC code information on a 256b D-local bus and 16b E-local bidirectional bus (shown combined at 310) which runs vertically through the bank. The 256b D-local and 16b E-local buses couple to respective 256b D-Global and 16b E-Global buses 506 and 510 associated with the data repair interface logic 126 of FIG. 1, and shown more specifically in FIG. 5.

For one embodiment, a memory unit or mat 302 may be viewed as an independent array of storage cells 312 along with associated row decoder logic 314, column decoder logic 316, and sense amplifier resources 318. For one specific embodiment, the array may be 516 bits tall and 512 bits wide. Each horizontal group of cells in a mat forms a 512b sub-row. A given full row for the bank Bank 0 includes the same sub-row across all 68 activated mats. Each full row may be further organized as 128 4-bit sub-columns, with each of the 68 activated mats contributing four bits to an overall 256b+16b column block. FIG. 3A further illustrates a full row, at 320, with corresponding 128×4b sub-rows that are identified by hexadecimal sub-row address "0FE". Each sub-row may be selected by the row decoder logic 314 and loaded into the sense amplifier structure 318 at the bottom of the mat 302.

For the example presented in FIG. 3A, there are 512 main sub-rows for each mat. Nine bits of a row address may be used to select one of the sub-rows using the row decoder logic 314. Another six address bits may be used to select one of the 64 horizontal mat stripes 308 in the bank Bank 0 using an enable control signal. A three-bit address may be employed to select one of the eight banks. A seven bit column address may be used to select one of the sub-columns using the column decoder logic 316.

FIG. 3A also illustrates four extra sub-rows, at 322, located at the top of the mat 302, that may be addressed at hexadecimal sub-row addresses {200,201,202,203}. Each of the spare sub-rows in a mat may be individually substituted for one of the 512 main sub-rows for the mat in case of an error. Each mat includes repair logic 324 that controls substitution of one or more of the spare sub-rows for a normal sub-row having a known error. Detailed view 3-2 shows how the repair logic employs a remapping table to, for example, substitute spare row address "200" for the normal sub-row address "0FE" in the corresponding mat 325.

In one embodiment, the memory bank Bank 0 may also include extra sub-column elements (not shown). They might be added as one or more groups of four vertical stripes of storage cells on the left side of the mat structure starting with a hexadecimal column address "080". The extra sub-columns could replace regular sub-columns in the same manner that spare sub-rows can replace regular sub-rows.

Typically there may be fewer spare sub-column elements than sub-row elements because they interact with the more critical column timing path rather than the row timing path. For this reason, in some embodiments this application uses spare sub-row elements only for post-manufacture repair. However, spare sub-column elements could be used, if available.

Figure 3B:
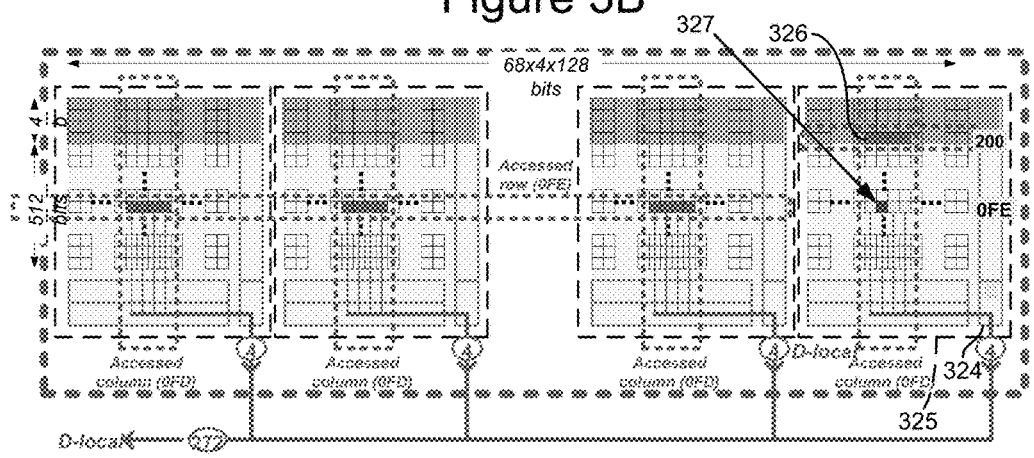
FIG. 3B illustrates a configuration of rows and mats similar to FIG. 3A for correcting single-bit errors through spare sub-row substitution.

FIG. 3B illustrates an allocation of mat stripe resources in the event that a spare sub-row is used to correct a single bit error detected in the accessed row. The exemplary mat stripe has the same row being accessed as that in FIG. 3A, and it is assumed that a single-bit error has been detected and identified in a sub-row location, at 327. As a result of a single-bit error repair process, more fully described below, the repair logic 324 may be programmed to substitute the storage cells at sub-row address 200 for the sub-row address "0FE" for mat 325.

In many situations, the repair logic 324 may configure the limited spare resources such that single-bit errors may be corrected via decoding of the EDC code, while multi-bit errors may need spare storage resources to repair the error. This may be handled by programming the repair logic to utilize the spare resources based on an error threshold value.

Figure 3C:
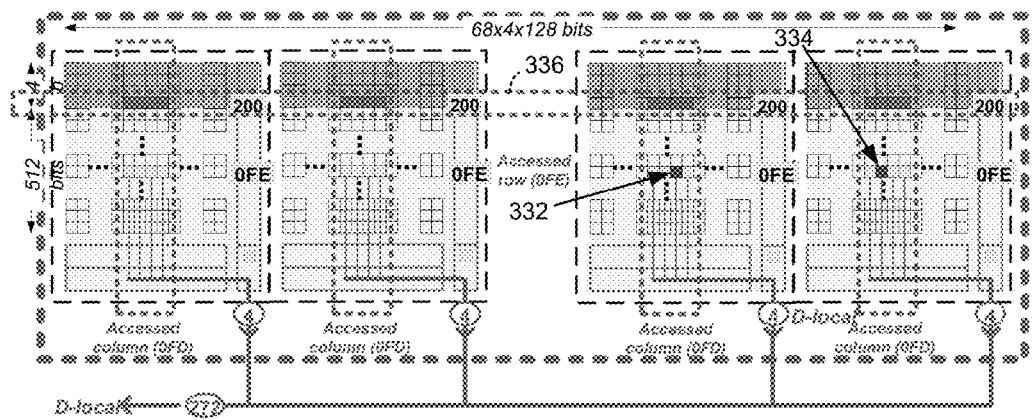
FIG. 3C illustrates a configuration of rows and mats similar to FIG. 3A for correcting multi-bit errors via an entire spare row substitution.

FIG. 3C illustrates a situation where at least two bit errors are detected in a given row, such as at 332 and 334. As a result of a multi-bit error repair process, more fully described below, the repair logic has been programmed to substitute an entire spare row 336 for the given row. The repair logic for each mat thus remaps the corresponding spare sub-row address 200 to substitute the originally addressed sub-row 0FE.

Figure 4:
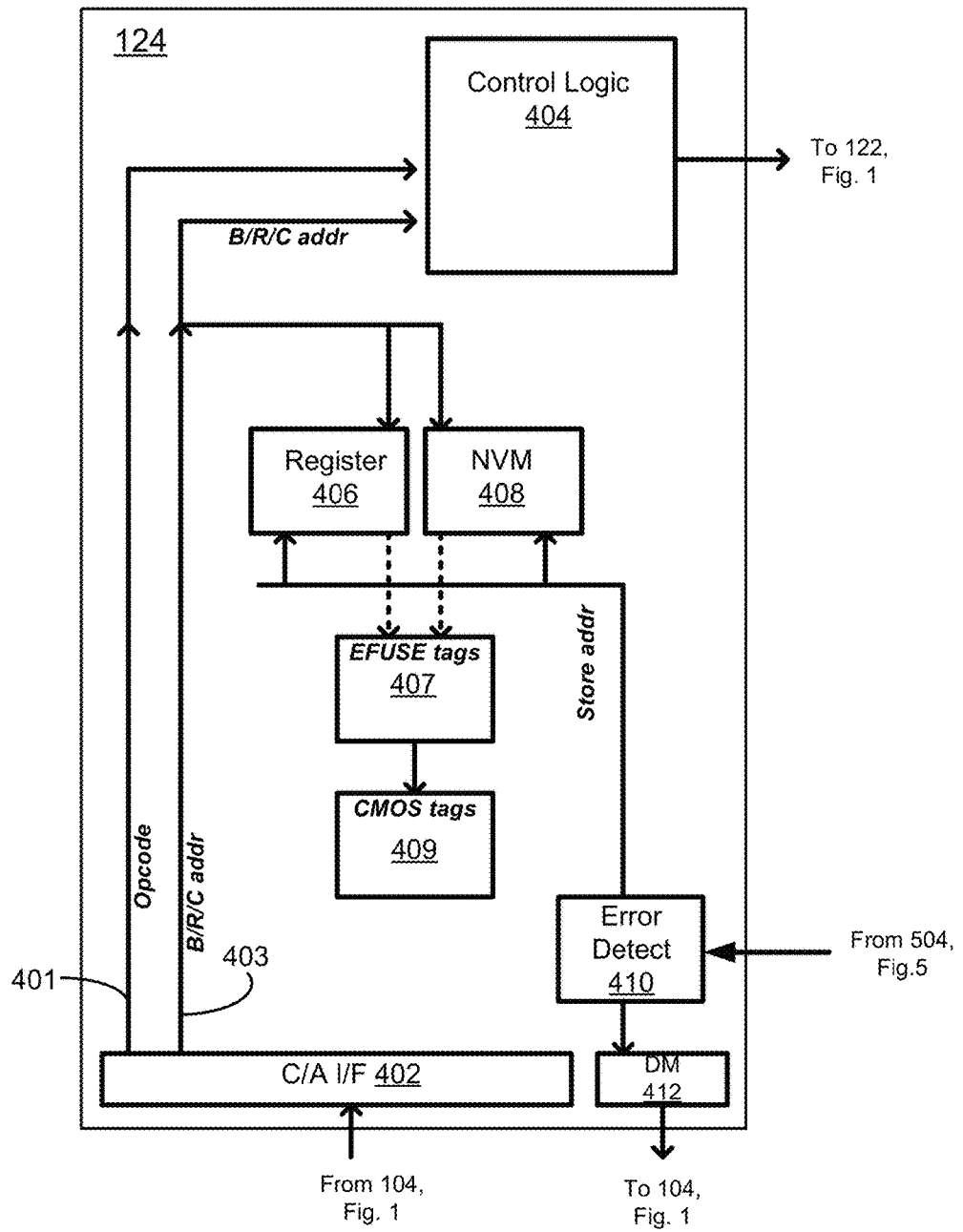
FIG. 4 illustrates one embodiment of control-address and repair interface logic employed by the memory device of FIG. 1.

Referring now to FIG. 4, one specific implementation of the C/A and repair interface logic 124 (FIG. 1) includes a C/A interface circuit 402 that receives control, command and address signals from the memory controller 102. The control, command and address signals are fed from the interface circuit 402 via respective opcode and address paths 401 and 403 to control logic 404 to access one or more banks 122 of the memory device 102. The address path 403 may be utilized in some embodiments to connect the C/A interface circuit 402 to one or more temporary storage elements such as a control register 406 and/or a nonvolatile error memory 408. The control register may be able to store a number of entries. For one embodiment, the register is a volatile structure. Each entry may include a bank, row, column and detected error. Non-volatile tag storage such as e-fuses may be employed to store information relating to repair mappings, at 407. Volatile tag storage may also (or alternatively) be utilized to store the repair mapping information, at 409. In such a scenario, the tag information may be loaded from off-chip non-volatile storage during device initialization.

An error detection circuit 410 couples to the error register 406 and/or error memory 408 to provide a control signal for the register/memory to store an address associated with a detected error location as data is retrieved from an addressed column, and decoded by error decoding circuitry in the data/repair interface logic 126, described more fully below. For one specific embodiment, a data mask (DM) interface 412 may be utilized for read operations to alert the memory controller 104 that an error has been detected for a given read data transfer.

Figure 5:
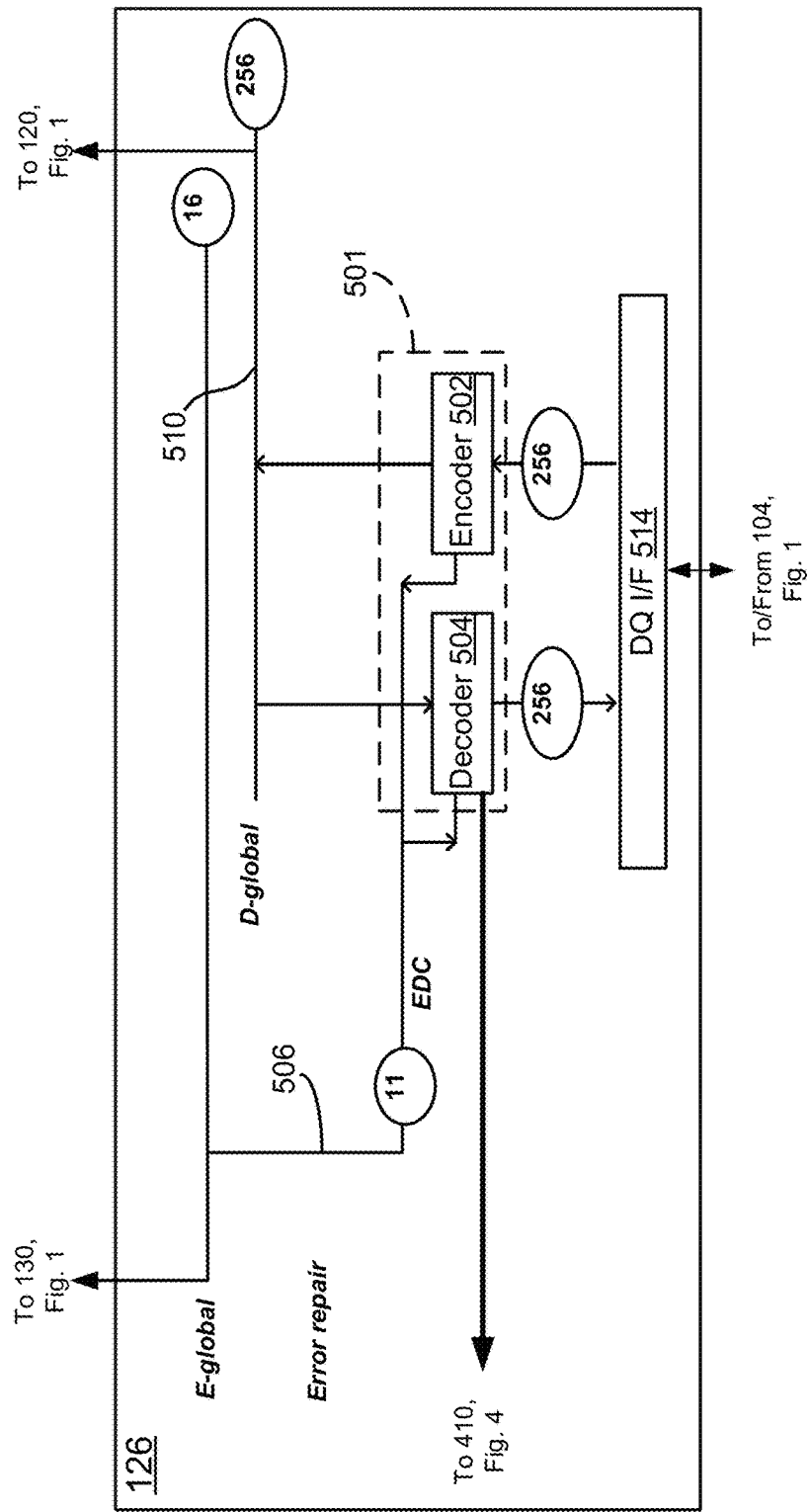
FIG. 5 illustrates one embodiment of a repair circuit for use in the data interface of FIG. 1.

Referring now to FIG. 5, one embodiment of the data/repair interface logic 126 (FIG. 1) employs error code circuitry such as EDC logic 501 that detects and/or corrects read and write errors based on error information stored in additional per-column resources in a way that balances the desirability of conserving limited spare storage resources and maintaining a "strength" or error detecting/correcting capability of an EDC code. For one embodiment, the error identification and repair may be done in a manner wholly transparent to the memory controller 104, thus providing an additional layer of error detection and correction capability that maximizes the EDC strength, or correction capability, of the coding carried out by the memory device 102.

Further referring to FIG. 5, the data/repair interface logic 126 generally includes a write data EDC encoder 502 and a read data EDC decoder 504. For one specific embodiment, the EDC encoder 502 encodes a given 256-bit column of data into 10 bits of parity information, an enable bit, and the original data. For write operations, the EDC parity bits generated by the encoder 502 are passed along a private internal bus (E-global) 506 to be loaded into a portion of the error array 130 corresponding to the addressed column. The original column data passes to a data bus (D-global) 510 for transfer to storage cells corresponding to the addressed bank, row and column in the memory core 120.

With continued reference to FIG. 5, the write data encoding may be generated in accordance with one of many acceptable EDC algorithms including, for example, straightforward single-bit Hamming codes, to more sophisticated high-speed BCH (Bose, Ray-Chaudhuri and Hocquenghem) codes. Other EDC codes, such as Reed-Solomon codes, turbo codes, cyclic redundancy codes (CRC) and low density parity check (LDPC) codes may also be acceptable. For one specific embodiment, a Single-Error Correct Double-Error Detect (SECDED) code is employed that is capable of generating error information that may be used to correct a single random error or detect a double bit error in a 256-bit column of data.

Further referring to FIG. 5, for read operations, decoding an EDC syndrome following receipt of an encoded read data word generates error information that allows for the correction of a single-bit error, with a pointer to the location of the error in the word or detection of a double-bit error. Should there be any errors detected by the decoder 504, the error information will be sent to the error detect circuit 410 in the C/A repair interface logic 124 (FIG. 4).

By detecting errors in the memory device 102, defective storage cells that form the basis for "hard" errors may be repaired for subsequent data transfers to and from the defective cells. This ensures that the error correction coding generated within the memory device 102 does not become overwhelmed by errors that may develop over time, thereby maintaining its error coding strength. Further, by handling the error detecting and repair in the memory device 102, very few if any changes to the circuitry in the memory controller 104 are needed to achieve the desired error tracking and repair functionality. Further, by enabling the EDC code to generate error information to correct single-bit errors, the limited EFUSE and spare sub-row resources may be conserved.

The memory architecture above lends itself well to providing an alternative way to carry out repairs at the discrete device manufacturing stage, such as when devices undergo functional test, and/or at the system level, such as when a memory module (having plural memory devices) undergoes final assembly and test. The architecture also advantageously provides repair capability during normal operation as a main memory system for computing resources. Failures identified during manufacture, such as in final module assembly and test, may be repaired as an alternative to, or complementary with, redundant row and column resources typically provided, and the repair information stored in the nonvolatile memory 408 (FIG. 4), until retrieved upon usage in a memory system operating environment.

Figure 6:
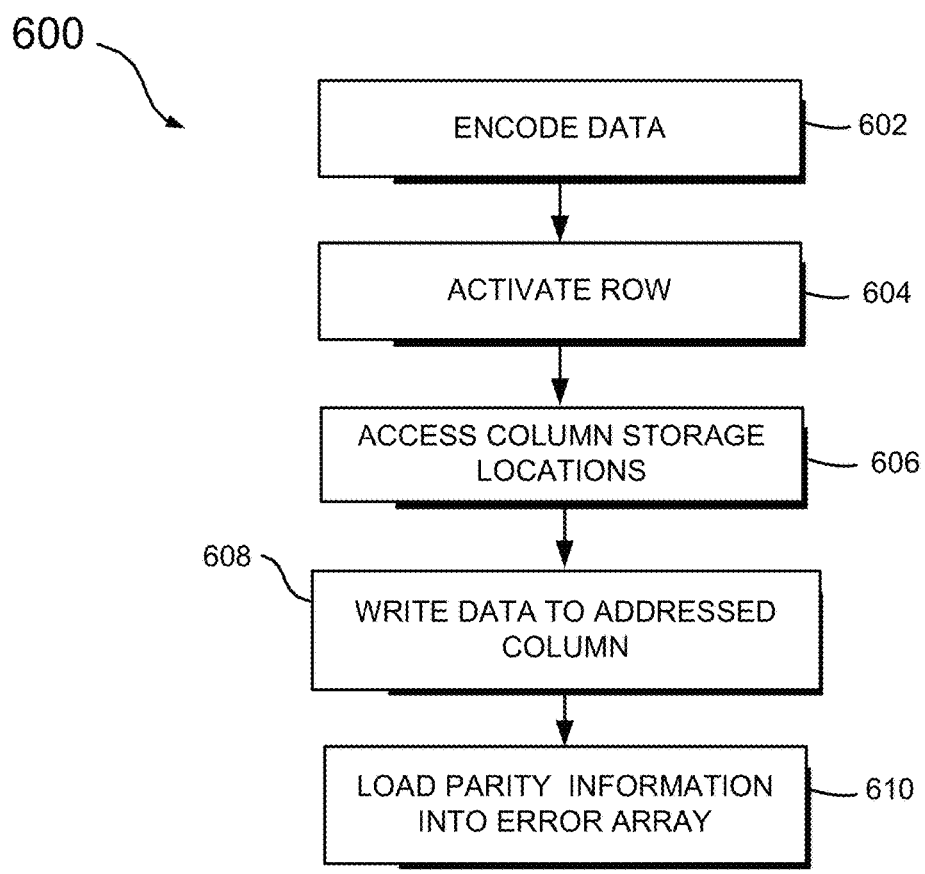
FIG. 6 illustrates a flowchart of steps carried out in a method of carrying out write operations for the memory device of FIG. 1.

FIG. 6 shows a flowchart of steps that may be performed in accordance with one embodiment of a repair method described herein during normal write operations using the circuitry described above and shown in FIGS. 1-5. The method, generally designated 600, seeks to take advantage of memory devices that employ error correction coding schemes, with little to no impact to the memory controller design. For some embodiments, an initialization procedure will have been carried out as the system is powered on. The initialization generally involves loading any previously stored error information, such as identified during manufacture or previous normal operations, from the nonvolatile storage into the tag information columns in the DRAM core. With the tag information stored in the DRAM core, normal repair operations may commence.

Referring still to FIG. 6, for a write operation that involves a given column of data (although many columns are usually involved in a given write operation), the data is first received by the memory interface and error encoded to generate ECC parity information, at 602. In response to a series of commands from the memory controller to write the specified column of data (in this example, a 256-bit column of data with an additional 10 parity bits generated by the ECC code) to a memory device, a corresponding row or page in an addressed bank is activated, at 604.

Further referring to FIG. 6, once the row is activated, the addressed column may then be accessed, at 606, and the write data written into the data array, at 608. The column access also involves writing the ECC parity information associated with the column into the error array, at 610. Write operations for additional column addresses may then be performed. In some circumstances, the write operation may involve a row having one or more known "hard" bit errors associated with it. The repair logic employed by the mat stripe for the row may be programmed to utilize a spare storage resource so that the hard error doesn't recur.

Figure 7:
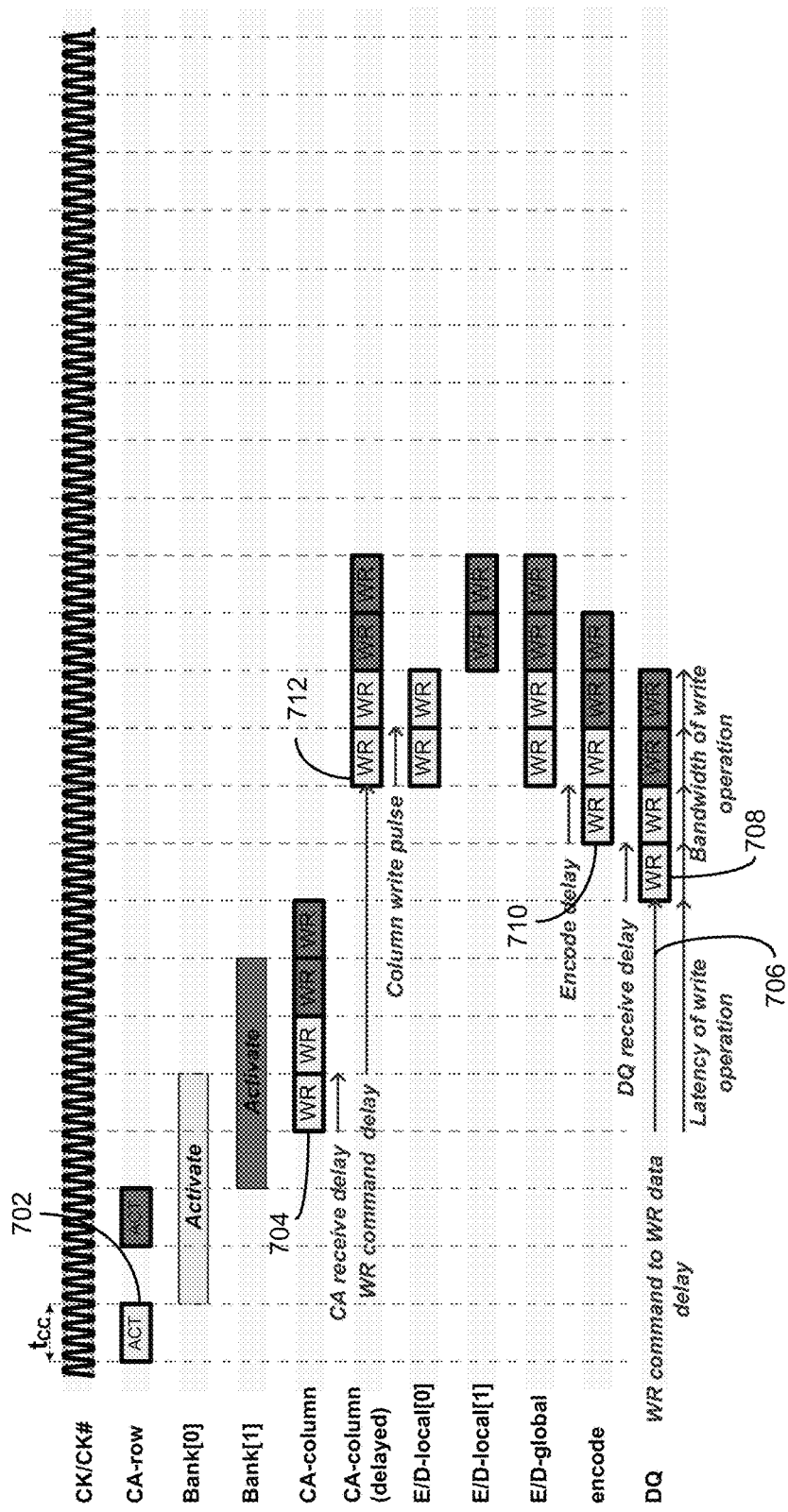
FIG. 7 illustrates a timing chart for pipelined write and repair operations involving the memory device of FIG. 1.

FIG. 7 illustrates a timing chart associated with pipelined write operations consistent with the method described above for FIG. 6. The waveform CK/CK# represents a timing reference for the write operations, where every four intervals of the clock corresponds to a column cycle time tCC. A tCC is a timing parameter that represents the minimum time necessary to carry out a column access. The timing chart illustrates write operations involving two banks Bank[0] and Bank[1], that operate in a round robin fashion. Respective shadings (light and dark) in the chart identify the respective bank operations, with the following detailed description focusing mainly on the bank Bank[0] (light grey) operations for purposes of brevity.

Further referring to FIG. 7, at 702, a row activate command ACT is received by the memory core. A write command is then received, at 704. After an adjustable delay, at 706, 256*b* of write data is received at 32 external DQ links, and a 1-to-8 deserialization takes place, at 708. The deserialized data is then encoded into a 16 bit EDC word and the 256 bit data word, at 710, then written into the activated row, at 712. The adjustable delay is usually set to match the latency of delay of a column read operation.

Figure 8:
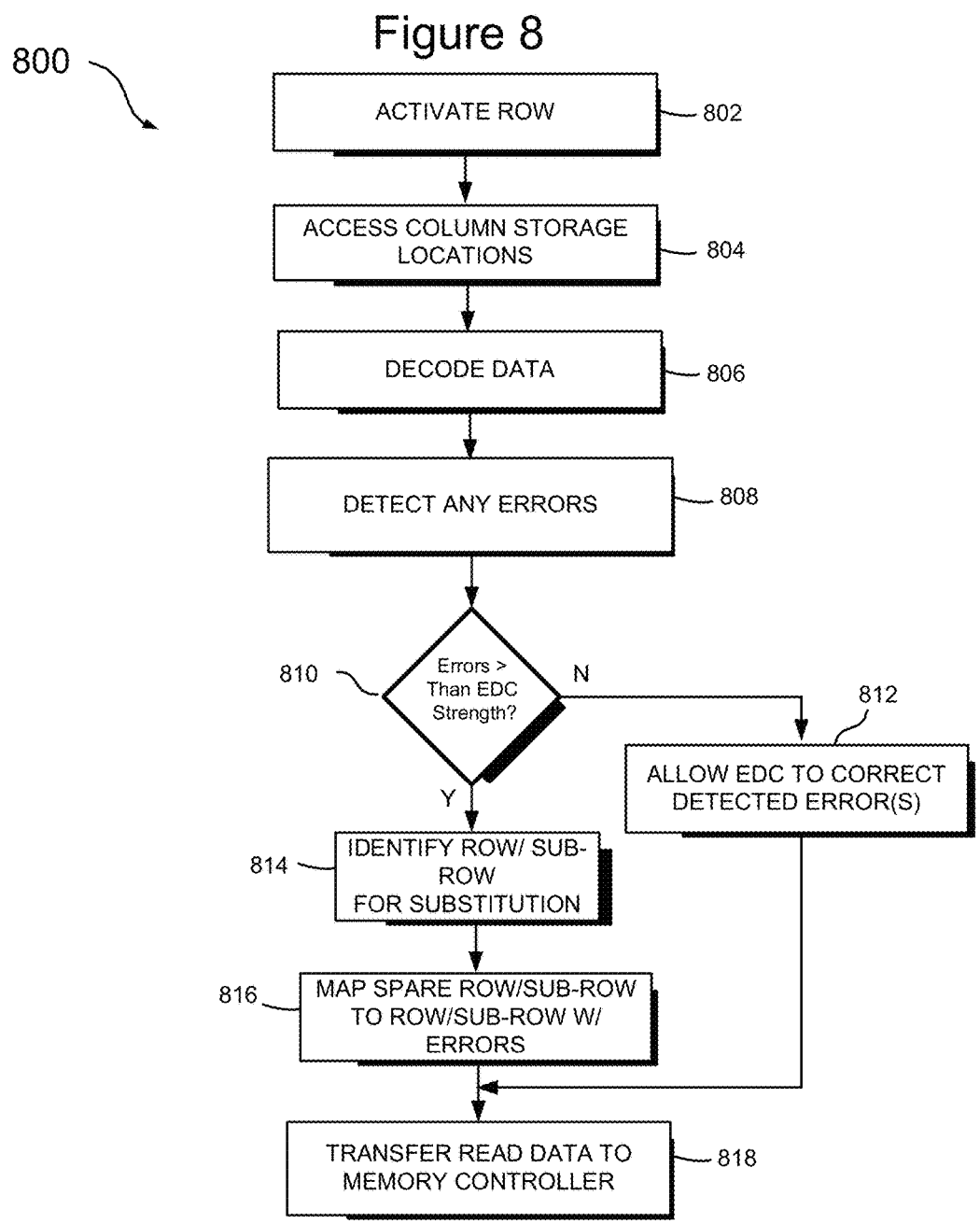
FIG. 8 illustrates a flowchart of steps carried out in a method of carrying out read operations for the memory device of FIG. 1.

FIG. 8 shows a flowchart of steps that may be performed in accordance with one embodiment of a repair method described herein during read operations, and generally designated 800. The method assumes that an initialization routine has already been carried out, and that all repair mapping information relating to the memory core has been stored in the appropriate storage registers. At 802, an activate command activates a given row in an addressed bank. The addressed data column in the core is then accessed, at 804. The accessed data is then decoded, at 806. The decoded data may be evaluated for any errors, at 808, which may be passed to the error detection circuit in the C/A repair interface logic.

If the number of detected errors is within the EDC "correction" strength, such as a single-bit error in the SECDED examples described herein, then a correction to the error may be based on whether a repair logic threshold for utilizing spare resources is set to a single-bit error, or multi-bit error. If the threshold is set such that spare resources are only used for multi-bit errors, then the single-bit error may be corrected based on the error information decoded by the EDC decoder, at 812. If the threshold is set such that spare resources are used even for single-bit errors, then a spare sub-row within the mat having the error may be identified, at 814, as a substitute storage location for the sub-row having the error. The identified spare sub-row is then mapped to the replaced sub-row by the repair logic, at 816.

For situations where the repair threshold for spare resource allocation is set to a multi-bit error value, then an entire row across all mats in a mat stripe may be substituted by a spare row, identified at 814, then mapped at 816. The read data may then be transferred to the memory controller, at 818. Note that the correction to the data may be carried out either by the decoding of the associated EDC, or through a substitution of data from a redundant resource mapped to store a bit value originally intended for a defective cell. Thus, in some situations, depending on the number of detected errors, the EDC may be unaffected by the known (and corrected) error.

Figure 9:
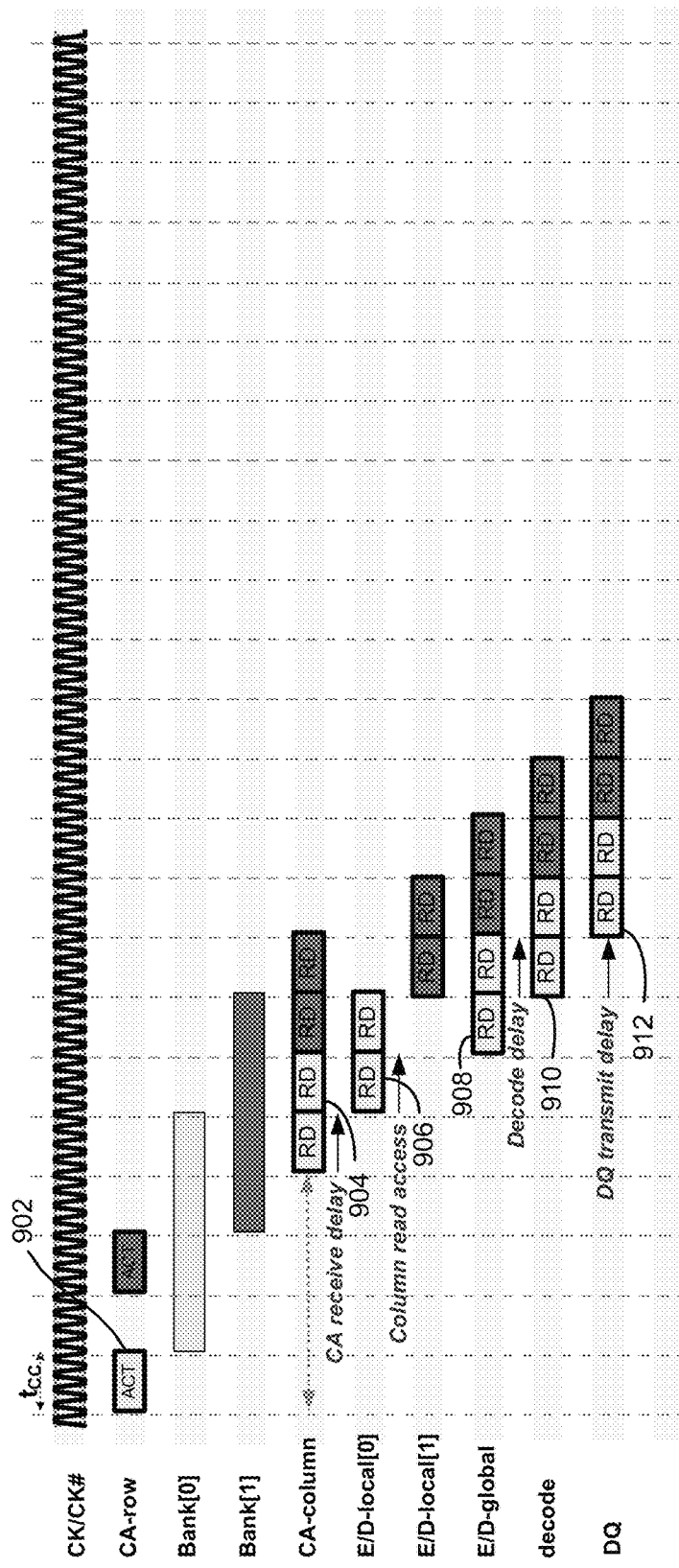
FIG. 9 illustrates a timing chart for pipelined read and repair operations involving the memory device of FIG. 1.

FIG. 9 illustrates a timing chart associated with pipelined read operations for a bank consistent with the method steps described above with respect to several of the read operation steps in FIG. 8. Two banks operating in a round robin fashion are shown, with the description below focusing on the operations highlighted in light grey shading, associated with Bank[0]. Like the timing chart of FIG. 7, the waveform CK/CK# represents a timing reference for the read operations, where every four intervals of the clock corresponds to a column cycle time tCC. At 902, a row activate command ACT is received by the memory core. In response to the activate command, at 904, a column read command is received by the core. Column read data corresponding to the column address is sensed and transferred along the local and global busses, at 906 and 908. The accessed data is then decoded, at 910, to determine if any errors are associated with the data. Following decoding, the data is then passed to the DQ interface for transfer to the memory controller, at 912.

Figure 10:
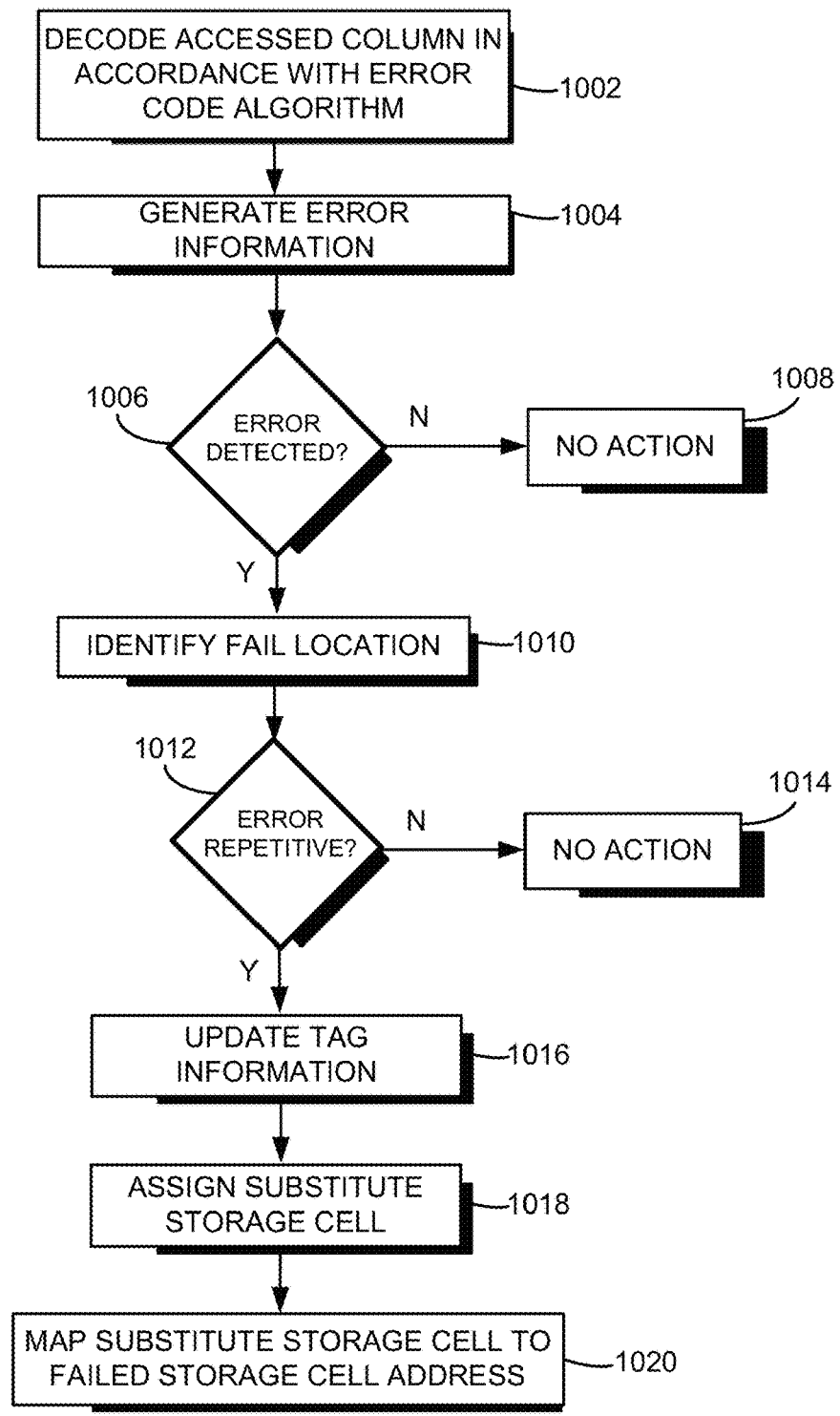
FIG. 10 illustrates a flowchart of steps carried out by one embodiment of a method to perform an actual repair to the memory device of FIG. 1.

FIG. 10 illustrates one embodiment of method steps that are involved when further errors are detected during read operations. This example assumes that an error that is detected can be corrected, so the read data that is returned to the controller has no errors. In one embodiment, this can be indicated using the data mask DM signals, which are typically not used during a read operation. As a read column of data is decoded, at 1002, error information may be generated, at 1004, such as through decoding of the syndrome associated with the data. Note that since a repair is to be made for subsequent accesses to a failed storage cell, the currently accessed data does not undergo a correction in the memory device, but rather at the memory controller (if an error is detected), or through a remedial read operation.

Further referring to FIG. 10, as a syndrome arrives at the C/A repair interface logic, a determination of whether an error was detected is first carried out by the error detection circuit, at 1006. This generally involves evaluating the syndrome, which not only detects the existence of an error, but if a single-bit error, also generates a pointer to the bit location of the error in the read data word. If no error is detected, no action takes place, at 1008, and the next error syndrome is evaluated on a subsequent cycle. If a single-bit error is detected, then the pointer is evaluated to identify the location of the error, at 1010. For some embodiments, a counter or other indicator may be employed to determine whether the error is a single event, or repetitive in nature, at 1012. If the error is not repetitive (based on a predetermined threshold, for example), no further action may take place, at 1014. If the error is repetitive, an assumption may be made that the error is the result of a failure in the associated memory cell, and the repair logic generates a tag entry for inclusion in the non-volatile memory (NVM 408, FIG. 4), at 1016. As explained above, the tag entry generally includes information such as the column address information and bit location of the failed cell.

Further referring to FIG. 10, with the ELOG tag generated and stored in the ELOG register (depending on whether the repair threshold is set to a single-bit error or multi-bit error), the repair logic may then assign a substitute sub-row or row, at 1018, to store future data bits directed to the failed storage cell address. A mapping is then generated, at 1020, that associates the failed storage location address to the newly assigned substitute storage resource.

The actual repair to the memory device does not necessarily happen immediately. It may happen when the DRAM enters a maintenance mode, such as a power-down-self-refresh. In some cases, the repair may happen when power is removed from the memory component, or when power is reapplied to the memory component (using a copy of the ELOG control register saved somewhere external to the memory component). If a non-volatile structure is available on the memory component (such as the non-volatile NVM 408 in FIG. 4), then this step may not be necessary.

In some embodiments, the actual repair may involve further detailed steps that supplement many of the general steps set out above. For example, once a determination is made that a repair needs to be carried out, the data and code in the sub-row with the error ("0FE" in this example, and referring to FIG. 3B) may be copied to a spare sub-row if any of this information belongs to a process that is still alive. The original process that accessed a given sub-column was probably terminated, and it's likely the entire sub-row belonged to the original process, so the copy step may be optional. Next, the repair logic for the mat may be programmed. Typically, the repair logic reads the non-volatile tag information from the fuses and stores it locally (in the mat) in volatile tag storage (such as the CMOS register). This usually happens automatically at power-on, but can also be forced via a control register operation.

For the mapping step 1020 noted above (FIG. 10), the remap logic programs an entry indicating that the sub-row address "0FE" will cause sub-row "200" to be used instead. This is accomplished, for one embodiment, with a 10-bit comparator (not shown) and an extra enable control bit in the sub-row addressing path. This example assumes four spare sub-rows which would involve four 10-bit CMOS registers, four 10-bit comparators, and some logic gates.

Double-bit errors may be handled by the error logic in a different manner than that noted above. Rather than using the information generated by the EDC to repair the errors (which may not be possible) or a spare sub-row, double-bit errors may be handled by using an entire spare row. Generally, address remapping logic in a stripe of mats is programmed to repair a double bit error in a column. In this example, the two error bits (bits at position 2 and position 5) in sub-column "03D" of sub-row "0FE" are detected (but not corrected). After repair, the sub-row "0FE" is replaced with spare sub-row "200" in all 68 mats so that a subsequent access to this sub-column will not get the double-error.

For some embodiments, the double-bit-error that is detected can't be corrected, and the read data that is returned to the controller has these errors. The process that generated the read request needs to be notified of the read errors, and the process may be terminated. As noted earlier, this can be indicated using the DM signals, which are not typically used during a read operation.

The repair may be logged in the ELOG control register 406 (FIG. 4) similar to that described previously. It may include the bank and row address of the error. The two bit addresses will be unknown, so it is likely that the column address will not need to be logged (even though it is known at the time of the error detection). For some embodiments, the uncertainty of the position of the bit errors within the column may dictate that the repair be made to all 68 mats in the horizontal stripe.

For one embodiment, the actual repair for a double-bit error may be handled similarly to the sub-row substitution process described above, albeit utilizing an entire row. First, the data and code in the row with the error ("0FE" in this example) is copied to the spare row if any of this information belongs to a process that is still alive. The copying happens in all 68 mats in the horizontal stripe. The original process that accessed column "0FD" was probably terminated, and it's likely the entire row belonged to this process, so this copy step may not be necessary.

Next, the repair logic of the 68 mats in the horizontal stripe may be programmed. The repair logic may add an entry indicating that the sub-row address "0FE" will cause sub-row "200" to be used instead.

Those skilled in the art will appreciate that the various embodiments described herein improve error correction abilities for memory systems that employ error correction schemes. For embodiments that allow for corrections of an additional bit for a given data word, error detection, correction and repair for memory devices may be extended by several orders of magnitude. This may significantly extend memory device lifetimes, and/or prevent premature in-system device failures. Further, for some of the embodiments described herein, changes to the memory controller may be minimized, and instead incorporated into the memory device.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

We claim:

1. A dynamic random access memory (DRAM) integrated circuit (IC) chip, comprising:
    a memory interface for coupling to an integrated circuit (IC) memory controller chip;
    multiple independent banks, each of the multiple independent banks accessible via a corresponding bank address generated by the IC memory controller chip and including a row of first DRAM storage locations to store a data word, the row including multiple sub-rows, each sub-row separately accessible via a corresponding sub-row address, the data word being encoded via an error code, the error code being used to generate error information, wherein the row includes second DRAM storage locations to store a portion of the error information generated by the error code, wherein the error information is used to correct either X bit errors or detect Y bit errors, where Y is greater than X;
    a spare sub-row element having substitute storage locations;
    logic disposed on the DRAM IC chip, the logic responsive to detected errors in the data word associated with a given one of the multiple sub-rows, the logic to (1) enable correction of the data word based on the error information where there are no more than X bit errors, and (2) substitute the spare sub-row element for the given one of the multiple sub-rows where there are at least Y bit errors in the given one of the multiple sub-rows.

2. The memory device according to claim 1, wherein the error code comprises a single error correct, double error detect (SECDED) error code.

3. The memory device according to claim 1, wherein the error information comprises parity bits for the data word.

4. The memory device according to claim 1, wherein the logic includes repair logic to specify an address of the spare row element as a substitute storage location for the given one of the multiple sub-rows having at least Y bit errors.

5. The memory device according to claim 4, wherein the repair logic is initially programmed at an initialization operation to load previously determined substitute sub-row address mappings.

6. A dynamic random access memory (DRAM) integrated circuit (IC) chip comprising:
    a memory interface for coupling to an integrated circuit (IC) memory controller chip;
    an array of memory units that form plural rows of DRAM storage locations, the DRAM storage locations to store data words that are encoded via an error code, the encoded data words including error information, wherein each of the DRAM storage locations store a portion of the error information generated by the error code, each memory unit including plural normal sub-rows of normal storage locations and a spare sub-row, wherein each of the plural normal sub-rows of DRAM storage locations is separately addressable and comprises an aggregate number of the plural normal sub-rows, each of the plural normal sub-rows having the same sub-row location across all of the memory units; and
    repair logic disposed on the DRAM IC chip to detect at least one error in a given one of the plural normal sub-rows based on the error code, and to selectively substitute the given one of the plural normal sub rows with the spare sub-row.

7. The memory device according to claim 6 wherein the error code generates error information for correcting X bit errors or detecting Y bit errors, where Y is greater than X.

8. The memory device according to claim 7 wherein the repair logic selectively substitutes the given one of the plural normal sub-rows with the spare sub-row based on the number of detected errors in the given one of the plural normal sub-rows.

9. The memory device according to claim 8 wherein the repair logic is responsive to detected errors to (1) enable correction of a data word based on the error information where there are no more than X bit errors, and (2) substitute the spare sub-row for the given one of the plural normal sub-rows in the row having at least Y bit errors.

10. The memory device according to claim 7, wherein each of the plural normal sub-rows includes plural addressable sub-columns, and wherein the spare sub-row is substituted for the given one of the plural normal sub-rows in response to detecting that one of the plural sub-columns contains Y errors.

11. The memory device according to claim 7, wherein each of the plural normal sub-rows includes plural sub-columns, and wherein the spare sub-row is substituted for the given one of the plural normal sub-rows in response to detecting multiple sub-columns of the plural sub-columns that each contain X bit errors, the multiple sub-columns having a total number of bit errors not greater than Y bit errors.

12. The memory device according to claim 6, wherein the repair logic substitutes the spare sub-row by moving data stored in the given one of the plural normal sub-rows with errors to the spare sub-row.

13. The memory device according to claim 6, wherein the repair logic substitutes the spare sub-row by specifying a spare sub-row address corresponding to the spare sub-row for subsequent data transfers intended for the given one of the plural normal sub-rows.

14. A method of operation in a dynamic random access memory (DRAM) integrated circuit (IC) chip, the method comprising:
   activating a row of DRAM storage cells, the row of DRAM storage cells including a data word that is encoded via an error code, wherein the row includes multiple sub-rows that are accessible via a sub-row address, the row including storage locations to store a portion of the error information generated by the error code, the error code to generate error information used for correcting either X bit errors or detecting Y bit errors in a given one of the multiple sub-rows, and where Y is greater than X;
   determining whether any bit errors exist in the given one of the multiple sub-rows; and
   correcting the detected bit errors with logic disposed on the DRAM IC chip by (1) enabling correction of a data word having no more than X bit errors, and (2) substituting a spare sub-row element for the given one of the multiple sub-rows in response to detecting at least Y bit errors in the given one of the multiple sub-rows.

15. The method of claim 14, wherein substituting the spare sub-row element includes moving data stored in the given one of the multiple sub-rows to the spare sub-row element.

16. The method of claim 14, wherein substituting the spare sub-row element includes specifying a spare sub-row address corresponding to the spare sub-row for subsequent data transfers.

17. The method of claim 14, wherein the error code comprises a single-error-correction and double error detection (SECDED) code such that X=1 and Y=2.

* * * * *